United States Patent [19]
Hirano et al.

[11] Patent Number: 5,411,624
[45] Date of Patent: May 2, 1995

[54] MAGNETRON PLASMA PROCESSING APPARATUS

[75] Inventors: Yoshihisa Hirano, Kodaira; Yoshifumi Takara, Machida; Masahiro Ogasawara, Hachioji, all of Japan

[73] Assignee: Tokyo Electron Limited, Tokyo, Japan

[21] Appl. No.: 173,473

[22] Filed: Dec. 27, 1993

Related U.S. Application Data

[63] Continuation-in-part of Ser. No. 917,293, Jul. 23, 1992, abandoned.

[30] Foreign Application Priority Data

Jul. 23, 1991 [JP] Japan .................. 3-207410

[51] Int. Cl.[6] .......................... H01L 21/00
[52] U.S. Cl. ...................... 156/345; 216/70
[58] Field of Search .......... 118/723 E, 723 ER, 728; 156/345, 643; 315/111.21, 111.41

[56] References Cited

U.S. PATENT DOCUMENTS

| | | | |
|---|---|---|---|
| 4,793,975 | 12/1988 | Drage | 156/345 X |
| 4,878,995 | 11/1989 | Arikado et al. | 156/643 |
| 5,147,497 | 9/1992 | Nozawa et al. | 156/626 |
| 5,292,399 | 3/1994 | Lee et al. | 156/345 X |

FOREIGN PATENT DOCUMENTS

| | | |
|---|---|---|
| 59-140375 | 11/1984 | Japan . |
| 61-289634 | 12/1986 | Japan . |
| 62-47130 | 2/1987 | Japan . |
| 62-69620 | 3/1987 | Japan . |

*Primary Examiner*—R. Bruce Breneman
*Assistant Examiner*—Jonathan D. Baskin
*Attorney, Agent, or Firm*—Oblon, Spivak, McClelland, Maier & Neustadt

[57] ABSTRACT

A magnetron plasma processing apparatus includes a reaction chamber for housing an object to be processed, an electric field generating device, provided in the reaction chamber and having a first electrode for placing the object to be processed thereon and a second electrode opposing the first electrode, for generating an electric field between the first and second electrodes, a magnetic field generating device for generating a magnetic field having a component perpendicular to the electric field, and a device for supplying a reaction gas into the reaction chamber to generate a magnetron plasma by functions of the electric field and the magnetic field. A ring for strengthening the component of the electric field perpendicular to the magnetic field and for increasing the plasma generated at the peripheral portion of the object to be processed is provided to surround the peripheral portion of the object to be processed.

17 Claims, 11 Drawing Sheets

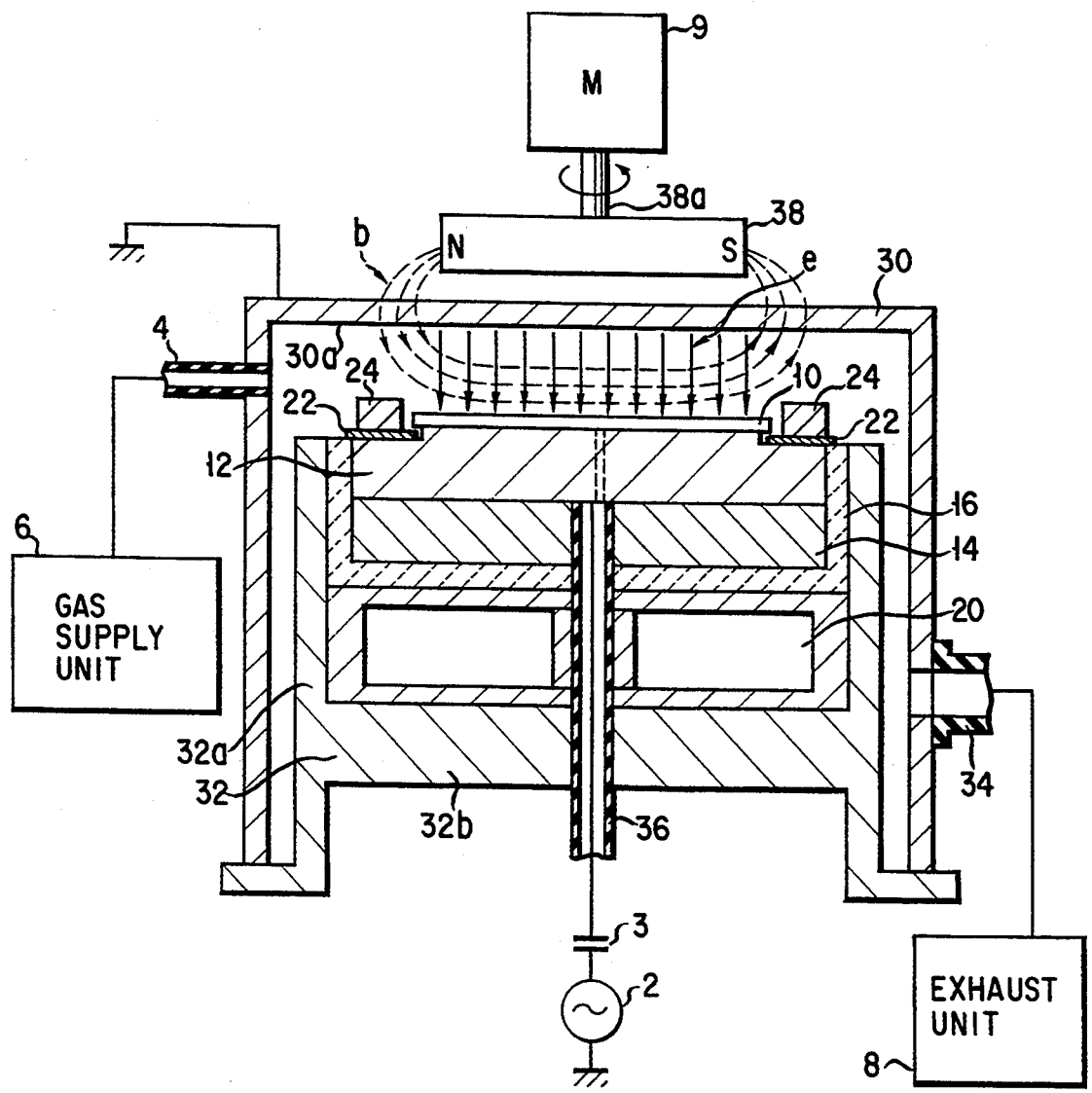
F I G. 1

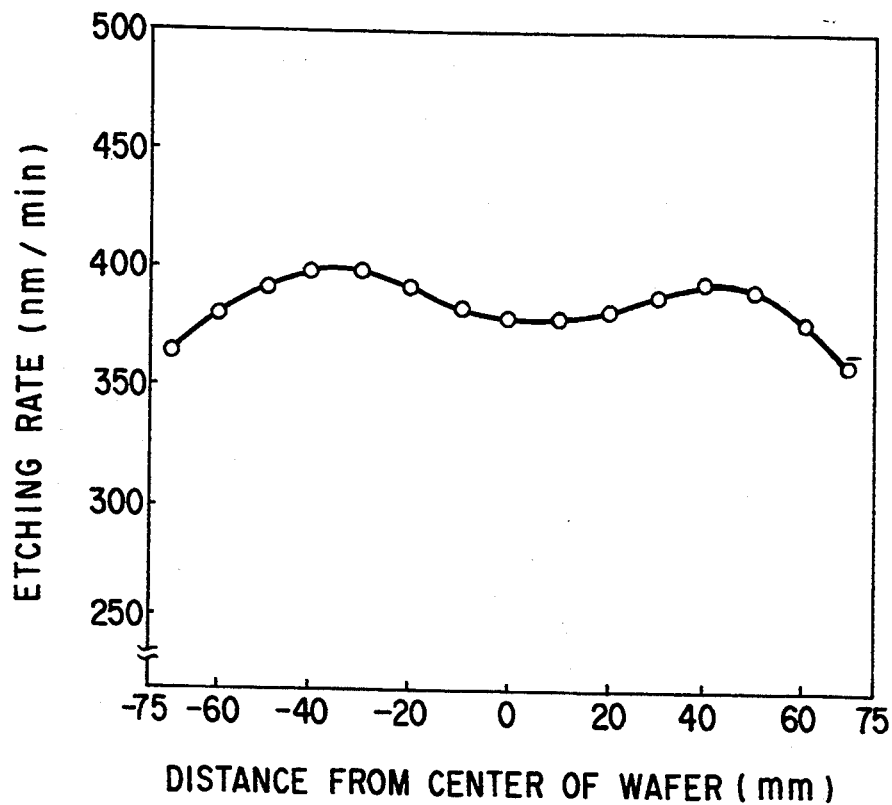
F I G. 4
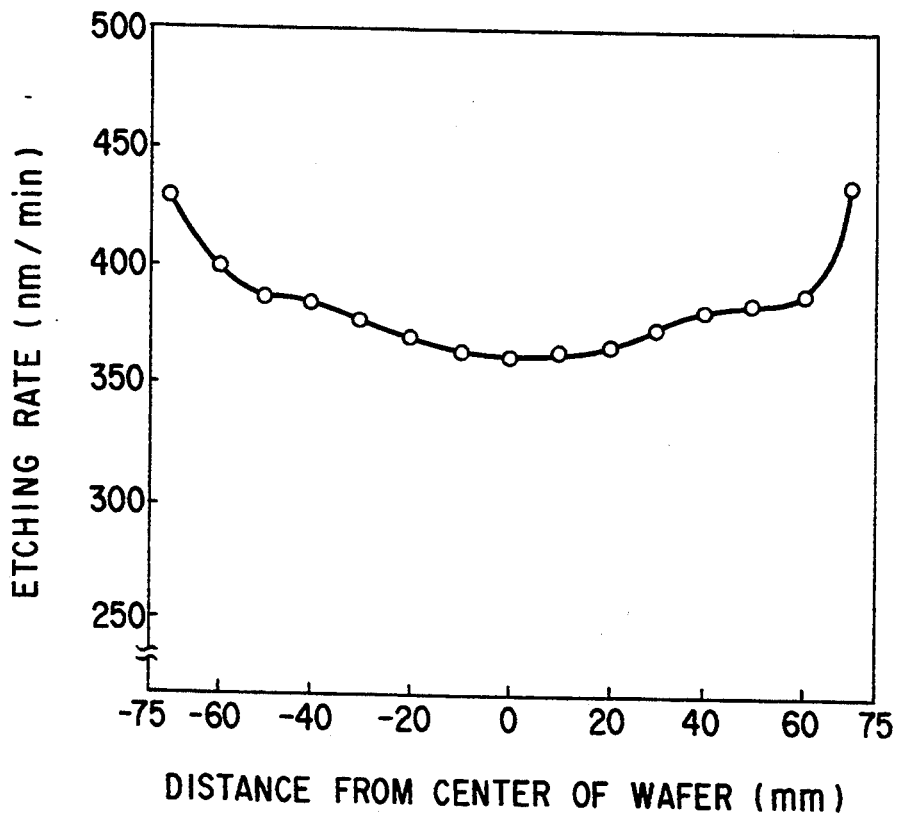
F I G. 5

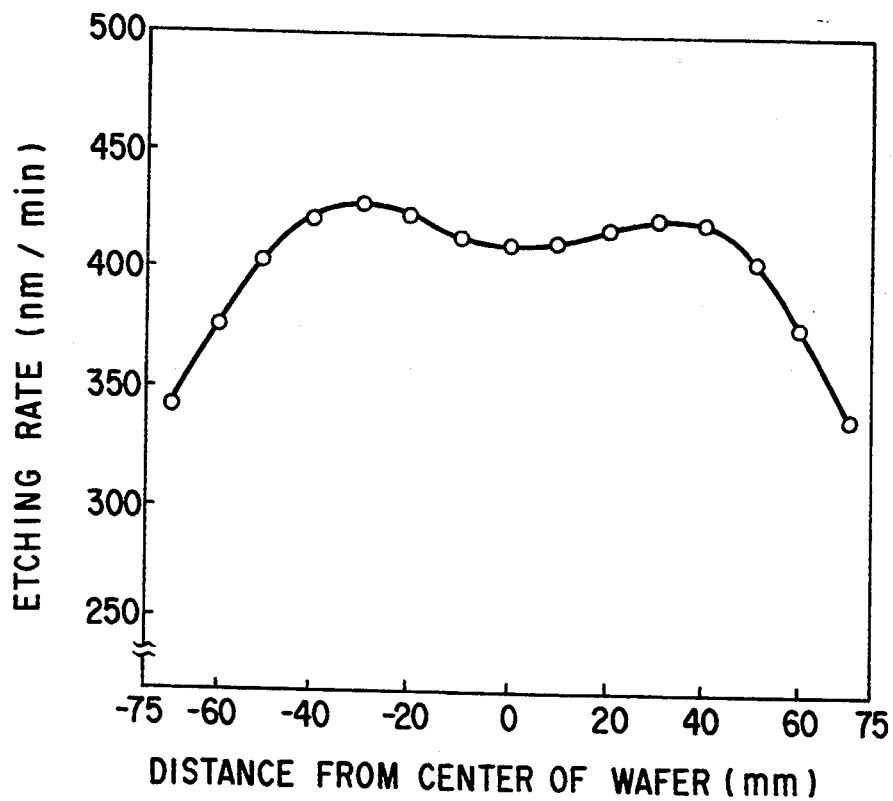
F I G. 6
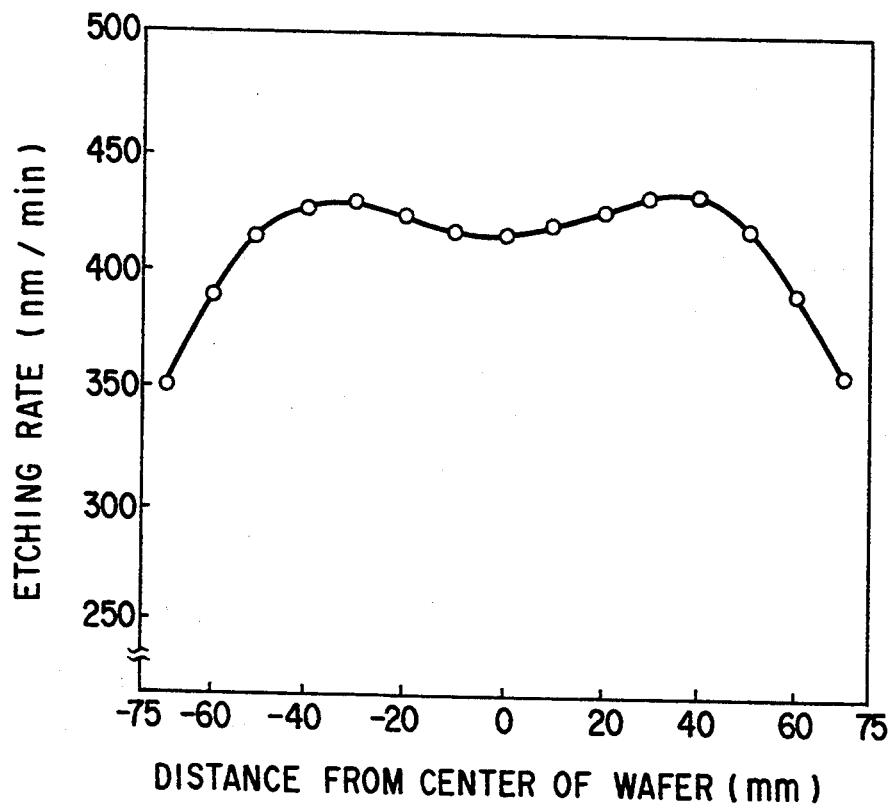
F I G. 7

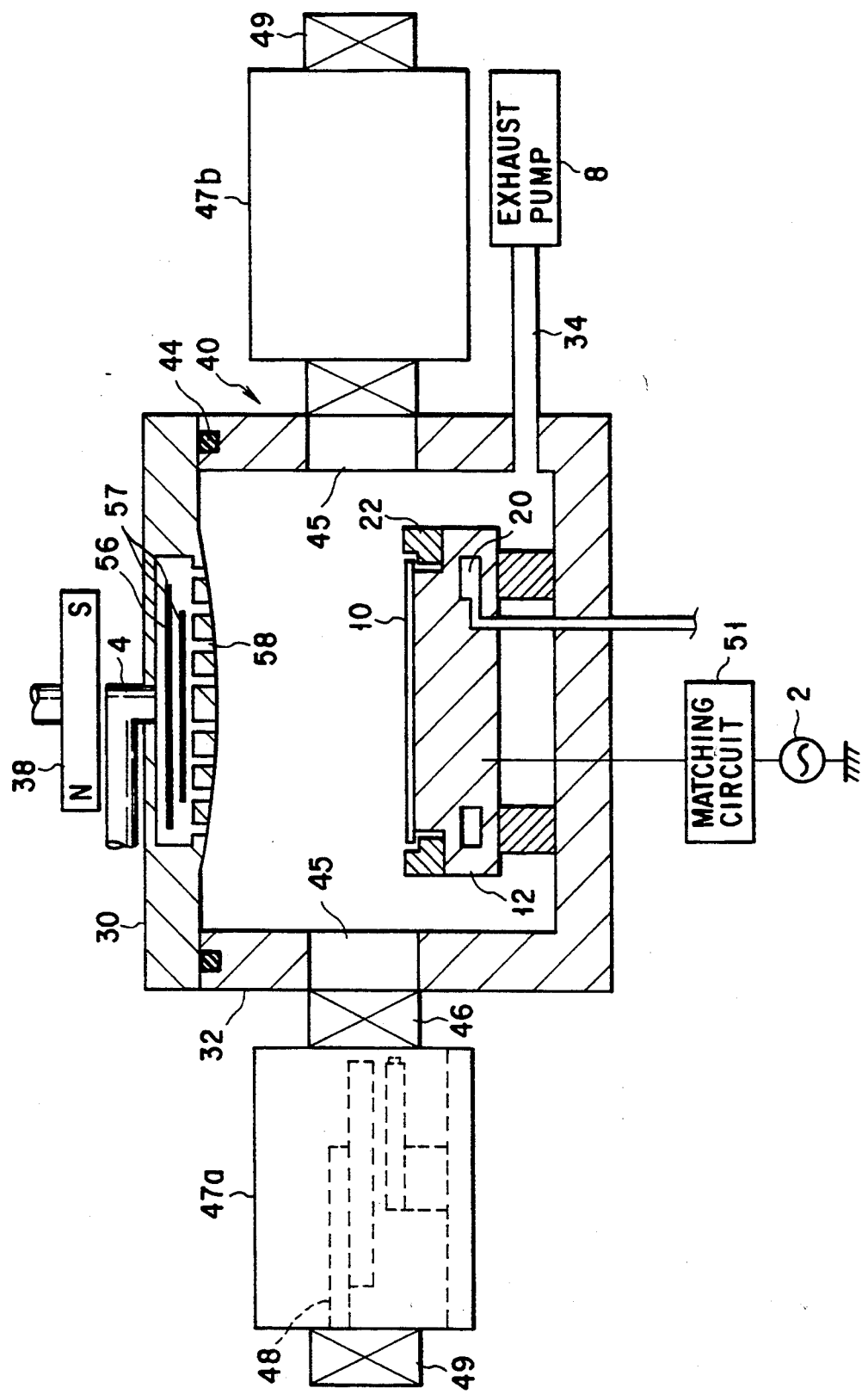
F I G. 11

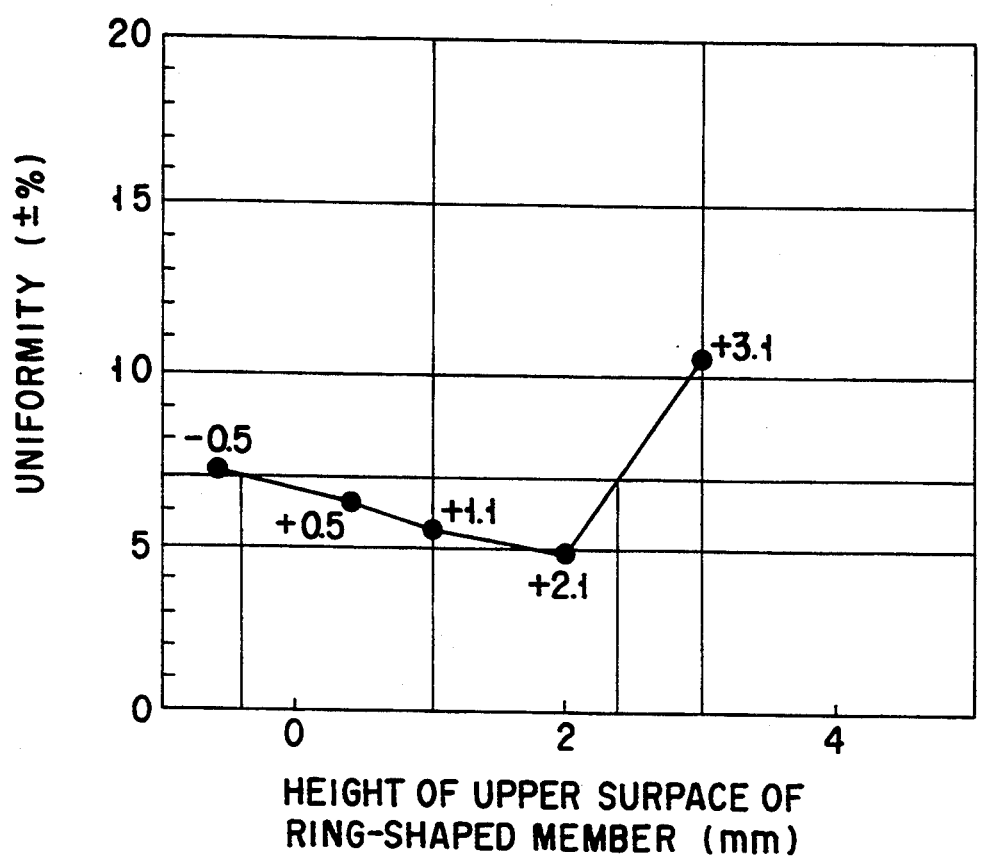
F I G. 19

MAGNETRON PLASMA PROCESSING APPARATUS

This application is a Continuation-in-Part of application Ser. No. 07/917,293, filed on Jul. 23, 1992, now abandoned.

BACKGROUND OF THE INVENTION

1. Field of the Invention

The present invention relates to a magnetron plasma processing apparatus used in, e.g., a semiconductor manufacturing system.

2. Description of the Related Art

As a conventional magnetron plasma processing apparatus, a dry etching apparatus and a thin-film deposition apparatus used in, e.g., the manufacture of semiconductor elements are known. In the magnetron plasma processing apparatus of this type, a plasma is generated in the processing chamber of the apparatus, and the function of ions, radicals, electrons, or the like in the plasma is utilized to perform desired processing (etching or thin-film deposition).

Such a magnetron plasma processing apparatus will be described by way of a magnetron plasma etching apparatus.

A magnetron plasma etching apparatus can perform evacuation and has a process chamber to which an etching gas can be supplied. A susceptor electrode for placing a wafer as an object to be processed and an upper electrode are provided in the processing chamber. Both the susceptor and upper electrodes are made of a conductive material. The upper electrode is grounded, and the susceptor electrode is connected to an RF power supply that outputs a high frequency power having a frequency of, e.g., 380 kHz or 13.75 MHz. With this arrangement, the upper and susceptor electrodes can be used as parallel plate electrodes to generate a plasma toward the wafer in accordance with cathode coupling (RIE). The ions or neutrons in the plasma react with or physically act on a silicon compound constituting the wafer, thereby etching the wafer.

In this apparatus, two permanent magnets supported by yokes are rotated by rotating shafts to generate between the upper and susceptor electrodes a magnetic field having a component parallel with the upper and susceptor electrodes. This aims at causing, by the function of the electric field generated between the upper and susceptor electrodes and the function of the component of the magnetic field perpendicular to the electric field, an electronic cycloidal movement in a direction perpendicular to both the electric field and the magnetic field to increase the frequency of collision between electrons and gas molecules. This increases an amount of generated plasma, and hence the etching rate.

In the plasma etching apparatus, the etching amount must be uniform throughout the surface of the wafer.

When, however, etching is performed by using the conventional magnetron plasma etching apparatus as described above, the etching rate generally becomes higher in the central portion of the wafer than in its peripheral portion, and thus the etching uniformity is not sufficiently satisfactory.

According to the studies made by the present inventor, in the central portion of a wafer, the magnetic field obtained by the permanent magnet is substantially parallel with the surface of the wafer, and thus the component of the magnetic field perpendicular to the electric field is strong. In contrast to this, the electric field generated in the peripheral portion of the wafer is not parallel with the surface of the wafer. Therefore, the component of the magnetic field perpendicular to the electric field is weak at the peripheral portion of the wafer, which is assumed to be the reason why the electronic cycloidal movement is unlikely to occur.

This problem happens not only in the magnetron plasma etching apparatus but also in a plasma sputtering apparatus or a plasma CVD apparatus which performs processing by using a plasma.

SUMMARY OF THE INVENTION

It is an object of the present invention to provide a magnetron plasma processing apparatus capable of uniformly processing a surface of an object to be processed.

The object of the present invention is achieved by a magnetron plasma processing apparatus comprising: a reaction chamber for housing an object to be processed; electric field generating means, provided in the reaction chamber and having a first electrode for placing the object to be processed thereon and a second electrode opposing the first electrode, for generating an electric field by the first and second electrodes; means for generating a magnetic field having a component perpendicular to the electric field; means for supplying a reaction gas into the reaction chamber to generate a magnetron plasma by functions of the electric field and the magnetic field; and plasma increasing means, provided to surround a peripheral portion of the object to be processed, for strengthening a component of the electric field perpendicular to the magnetic field and increasing an amount of plasma generated at the peripheral portion of the object to be processed.

Alternatively, a magnetron plasma processing apparatus according to the present invention comprises: a reaction chamber for housing an object to be processed; electric field generating means, provided in the reaction chamber and having a first electrode for placing the object to be processed thereon and a second electrode opposing the first electrode, for generating an electric field by the first and second electrodes; magnetic field generating means for generating a magnetic field having a component perpendicular to the electric field; means for supplying a reaction gas into the reaction chamber to generate a magnetron plasma by functions of the electric field and the magnetic field; and a ring disposed on the first electrode to surround a peripheral portion of the object to be processed and having a thickness with which a distance between an upper surface thereof and the second electrode is shorter than a distance between an upper surface of the object to be processed placed on the first electrode and the second electrode.

According to the present invention, the strength of the electric field in the vicinity of the peripheral portion of the object to be processed is increased to increase the amount of generated magnetron plasma, so that the amount of generated magnetron plasma of the entire magnetron plasma generating region is uniformed and the object to be processed can be uniformly processed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic sectional view of a magnetron plasma etching apparatus according to the first embodiment of the present invention;

FIG. 4 is a graph showing a measurement result of a variation in wafer etching rate when the upper surface of an auxiliary ring is higher than the etching surface of the wafer by 1.5 mm in the magnetron plasma etching apparatus according to the first embodiment of the present invention;

FIG. 5 is a graph showing a measurement result of a variation in wafer etching rate when the upper surface of an auxiliary ring is higher than the etching surface of the wafer by 3.5 mm in the magnetron plasma etching apparatus according to the first embodiment of the present invention;

FIG. 6 is a graph showing a measurement result of a variation in wafer etching rate when an auxiliary ring is not provided in a magnetron plasma etching apparatus according to the second embodiment of the present invention;

FIG. 7 is a graph showing a measurement result of a variation in wafer etching rate when the upper surface of an auxiliary ring is higher than the etching surface of the wafer by 1.5 mm in the magnetron plasma etching apparatus according to the second embodiment of the present invention;

FIG. 11 is a schematic view showing a structure of an etching apparatus for etching an SiO$_2$ film according to a third embodiment of the present invention;

FIG. 19 is a graph showing the relation between the configuration of the ring-shaped member and the uniformity.

DETAILED DESCRIPTION OF THE PREFERRED EMBODIMENTS

The preferred embodiments of the present invention will be described with reference to the accompanying drawings.

Figure 2:
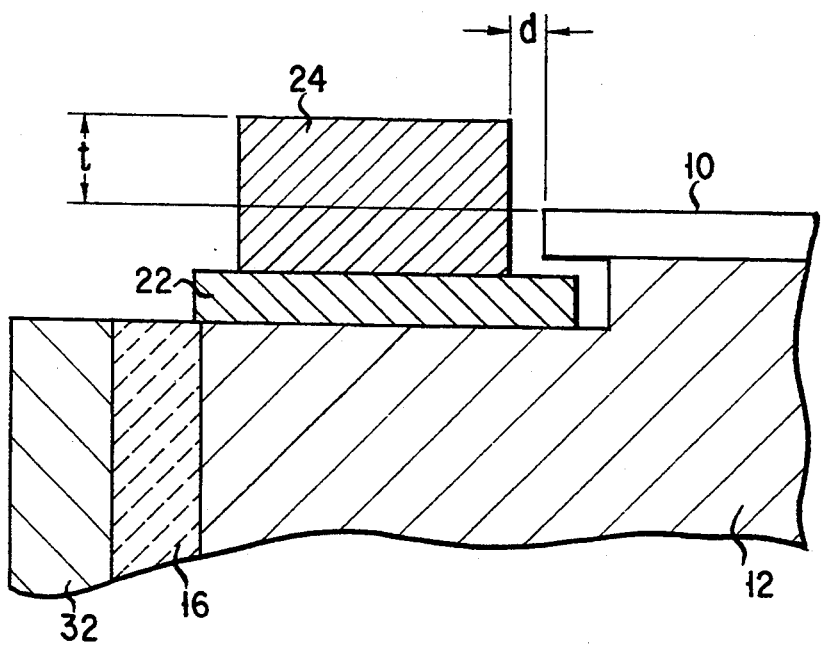
FIG. 2 is an enlarged sectional view showing a cathode ring and an auxiliary ring provided in the magnetron plasma etching apparatus shown in FIG. 1.

FIGS. 1 and 2 show the first embodiment in which a magnetron plasma processing apparatus of the present invention is applied to a magnetron plasma etching apparatus.

As shown in FIG. 1, a wafer 10 as an object to be processed is placed and chucked on the upper surface of a first susceptor 12 to which a power is supplied from a high-frequency power supply 2 through a capacitor 3. To place and fix the wafer 10, e.g., an electrostatic chuck (not shown) can be used. The electrostatic chuck attracts and fixes the wafer 10 by the Coulomb force. The first susceptor 12 is detachably fixed on the upper surface of a second susceptor 14. The susceptor is divided into two pieces in this manner so that when the susceptor is soiled, only the upper first susceptor 12 need be exchanged to facilitate maintenance of the susceptor.

The side surfaces of the first and second susceptors 12 and 14 and the bottom surface of the second susceptor 14 are covered with an insulating ceramic member 16. A liquid nitrogen container section 20 as a cooling section is provided on the lower surface of the insulating ceramic member 16. The inner wall surface of the liquid nitrogen container section 20 is formed, e.g., porous to cause nucleate boiling, and can maintain the liquid nitrogen contained in the container section 20 at −196° C.

A chamber assembly for defining a reaction chamber is constituted by upper and lower chamber elements 30 and 32. The lower chamber element 32 has a bottomed cylindrical shape to expose only a surface of the first susceptor 12 that places the wafer 10 thereon to the interior of the chamber assembly. More specifically, the lower chamber element 32 has a side wall 32a to cover the side surfaces of the first and second susceptors 12 and 14, the insulating ceramic member 16, and the liquid nitrogen container section 20, and a bottom wall 32b. The upper chamber element 30 has a cylindrical shape to surround the side wall 32a of the lower chamber element 32, and the lower portion of the upper chamber element 30 is coupled and fixed to the lower chamber element 32. The upper chamber element 30 has an inner surface 30a to oppose the upper surface of the first susceptor 12. An etching gas is supplied into the chamber assembly from a gas supply unit 6 through a gas inlet pipe 4 connected to the upper chamber element 30.

The interior of the reaction chamber constituted by the upper and lower chamber elements 30 and 32 can be evacuated by an exhaust unit 8 through a pipe 34.

As shown in FIG. 1, a through hole is formed to extend through the first and second susceptors 12 and 14, the insulating ceramic member 16, and the liquid nitrogen container section 20, and a pipe 36 is inserted in this through hole. A gap due to small unevenness on the lower surface of the wafer 10 is present between the bonding surfaces of the wafer 10 and the first susceptor 12 to cause a temperature variation in the wafer 10. However, when H₂ gas having a predetermined pressure is filled in the gap through the pipe 36, the heat of the entire wafer 10 is conducted to the susceptor 12 to prevent the temperature variation. A cable for connecting the high-frequency power supply 2 and the first susceptor 12 extends through the pipe 36.

In the magnetron etching apparatus of this embodiment, the upper chamber element 30 is grounded, the inner surface 30a of the upper chamber element 30 is set to serve as the cathode electrode, and the surface of the first susceptor 12 is set to serve as the anode electrode, thus constituting the RIE type magnetron plasma etching apparatus. While the interior of the chamber assembly is evacuated, the etching gas is supplied into the chamber assembly from the gas supply unit 6 to generate a plasma originated from the etching gas between the opposing electrodes.

In this embodiment, since the inner surface 30a of the upper chamber element 30 is used as the anode electrode, as described above, the arrangement of the apparatus can be made simple, and a permanent magnet 38 to be described later can be disposed outside the upper chamber element 30. When the permanent magnet 38 is disposed outside the upper chamber element 30, the volume of the reaction chamber can be decreased, and thus the load on the vacuum pump of the exhaust unit 8 connected to the pipe 34 can be decreased, or an evacuation time can be shortened.

In the magnetron etching apparatus of this embodiment, when the permanent magnet 38 is rotated by a motor 9 connected to it, a rotating magnetic field b can be generated between the inner surface 30a of the upper chamber element 30 and the first susceptor 12. When the magnetic field b is generated, an electronic cycloidal movement is caused by the function of an electric field e generated between the inner surface 30a of the upper chamber element 30 and the first susceptor 12 and the function of the component of the magnetic field perpendicular to the electric field e, in a direction perpendicular to the both fields in accordance with the Fleming's left-hand rule, thereby increasing the frequency of collision between electrons and gas molecules.

A conductive cathode ring 22 made of, e.g., SiC or amorphous carbon is placed on the upper surface of the first susceptor 12 to extend along the outer circumference of the wafer 10, and an auxiliary ring 24 made of a conductive material, e.g., SiC or amorphous carbon is placed on the upper surface of the cathode ring 22. The cathode and auxiliary rings 22 and 24 can be made integrally with each other.

FIG. 2 is an enlarged view showing the cathode and auxiliary rings 22 and 24. When the auxiliary ring 24 is placed on the upper surface of the cathode ring 22, as shown in FIG. 2, the upper surface of the auxiliary ring 24 is set higher than the etching surface of the wafer 10, so that the strength of the high-frequency electric field in the space above the auxiliary ring 24 becomes larger than that of the electric field in the space above the wafer 10.

The magnetic field b formed by the permanent magnet 38 is substantially horizontal above the central portion of the wafer 10, as indicated by broken lines in FIG. 1, and the inclination of this magnetic field b is larger as it is closer to the peripheral portion of the wafer 10 (that is, the vertical component is larger). Therefore, if the electric field generated between the anode electrode (the inner surface 30a of the upper chamber element 30) and the cathode electrode (the first susceptor 12) is uniform at every region between the two electrodes, the electronic cycloidal movement described above is most active above the central portion of the wafer 10 and less active as it is closer to the peripheral portion of the wafer 10. Hence, the etching rate of the wafer 10 is higher at the central portion of the wafer 10 and is lower as it is closer to the peripheral portion of the wafer 10.

For this reason, in the magnetron plasma etching apparatus of this embodiment, the auxiliary ring 24 is provided to increase the strength of the electric field in the space above the auxiliary ring 24 to be higher than that of the electric field e in the space above the wafer 10. As a result, the force (strength H of electric field x strength B of magnetic field) acting on the electrons in a region generating the magnetron plasma is uniformed, and the electronic cycloidal movement is uniformly performed entirely in the magnetron plasma generating region, thereby uniforming the etching rate. At the same time, it is assumed that a radial electric field is generated around the auxiliary ring 24. As this radial electric field has many components perpendicular to the inclined magnetic field above the peripheral portion of the wafer 10, it can activate the electronic cycloidal movement above the peripheral portion of the wafer 10 as well. In this manner, the etching rate can be uniformed from this point of view as well.

Figure 3:
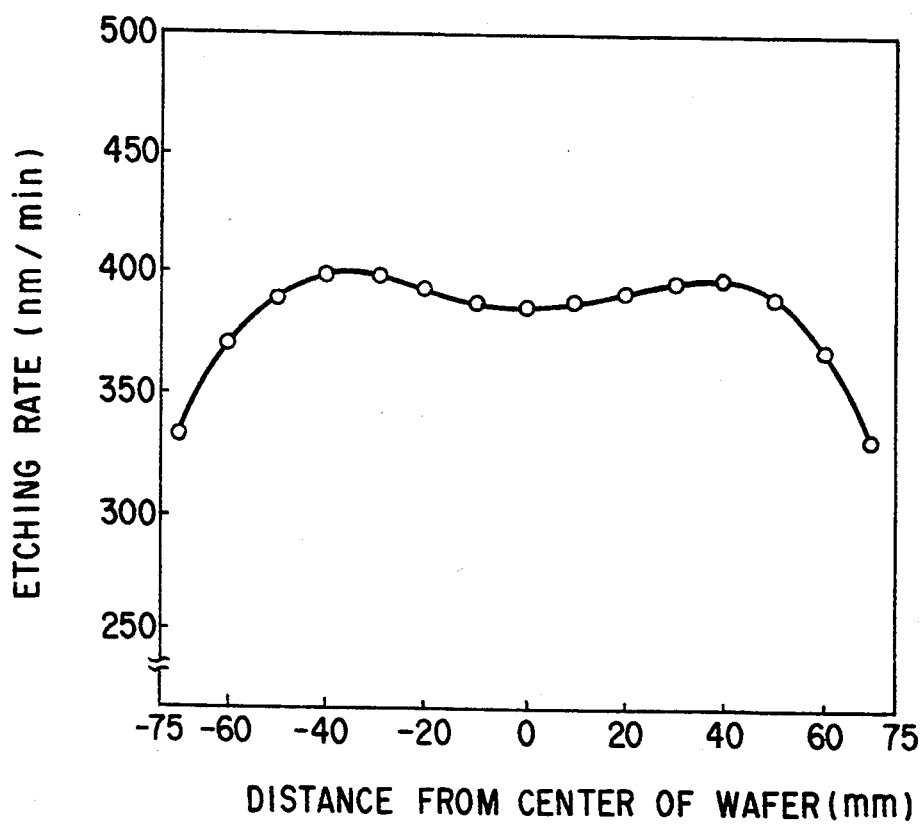
FIG. 3 is a graph showing a measurement result of a variation in wafer etching rate when an auxiliary ring is not provided in the magnetron plasma etching apparatus according to the first embodiment of the present invention.

FIGS. 3 to 5 are graphs each showing a measurement result of a variation in etching rate of the wafer 10. Referring to FIGS. 3 to 5, the axis of abscissa represents a distance (unit: mm) from the center of the wafer 10, and the axis of ordinate represents an etching rate (unit: nm/min.). Measurements were conducted in accordance with the measuring conditions shown in Table 1 below. The gap (d in FIG. 2) between the outer circumference of the wafer 10 and the auxiliary ring 24 was set to 1.5 mm. However, the gap can be set in the range of 1 to 2 mm. Although the width of the auxiliary ring 24 was set to 17 mm, it can be set in the range of 1 to 20 mm.

TABLE 1

| Pressure | 40 mTorr |
|---|---|
| Gas | $CHF_3$ |
| Gas Flow Rate | 50 SCCM |
| Wafer Size | φ 150 mm |
| RF Power | 600 W |

FIG. 3 shows a measurement result obtained when an auxiliary ring 24 is not provided. As is apparent from FIG. 3, when an auxiliary ring 24 is not provided, the etching rate is generally high at the central portion of the wafer 10 and low at the peripheral portion of the wafer 10. The measurement result shows that the average etching rate of the entire etching surface of the wafer 10 was 379.6 nm/min. and that the variation in etching rate was ±9.3% with reference to this average.

FIG. 4 shows a measurement result obtained when the upper surface of the auxiliary ring 24 is higher than the etching surface of the wafer 10 by 1.5 mm, i.e., when t=1.5 mm in FIG. 2. The average etching rate was 379.7 nm/min. and the variation in etching rate was ±5.4%. Considering a measurement error, this average etching rate can be regarded as almost identical to that of a case with no auxiliary ring 24. In this manner, when the auxiliary ring 24 higher than the etching surface of the wafer 10 by 1.5 mm was used, the variation in etching rate was remarkably decreased without decreasing the etching rate.

FIG. 5 shows a measurement result obtained when the upper surface of the auxiliary ring 24 is higher than the etching surface of the wafer 10 by 3.5 mm, i.e., when t=3.5 mm in FIG. 2. The average etching rate was 378.2 nm/min. and the variation in etching rate was ±9.5%. Considering a measurement error, the average etching rate of this case can be regarded as almost identical to that of a case with no auxiliary ring 24. As is apparent from FIG. 5, when the auxiliary ring 24 higher than the etching surface of the wafer 10 by 3.5 mm was used, the etching rate was low at the central portion of the wafer 10 and high at the peripheral portion of the wafer 10, which is opposite to the case shown in FIG. 3. As a result, the variation in etching rate becomes almost the same as the case of FIG. 3.

In this manner, when the auxiliary ring 24 is used, the etching rate at the peripheral portion of the wafer 10 can be increased without changing the average etching rate at all. An increase in etching rate at the peripheral portion of the wafer 10 can be controlled by the height of the auxiliary ring 24. Hence, the etching rate of the wafer 10 can be uniformed by appropriately selecting the height of the auxiliary ring 24. However, if the height of the auxiliary ring 24 is set higher than the etching surface of the wafer 10 by 3.5 mm or more, the etching rate in the peripheral portion of the wafer 10 is excessively increased to degrade the uniformity of the etching rate. Therefore, it is preferable that the difference in height between the auxiliary ring 24 and the etching surface of the wafer 10 is set less than 3.5 mm.

When the auxiliary ring 24 is made of a conductive material, e.g., SiC, the charge-up damage to the auxiliary ring 24 during plasma processing can be minimized.

A magnetron plasma etching apparatus according to the second embodiment of the present invention which has an auxiliary ring 24 made of an insulating material will now be described.

The arrangement of the magnetron plasma etching apparatus of this embodiment is similar to that shown in FIG. 1, except that an auxiliary ring 24 is made of an insulating material, e.g., quartz (SiO$_2$) in this embodiment. However, the auxiliary ring 24 may be made of a silicon material, e.g., monocrystalline silicon, polycrystalline silicon and amorphous silicon. Also, only the surface thereof or, in particular, the upper surface thereof, may be made of a silicon material.

In this embodiment, the etching rate in the peripheral portion of a wafer 10 is increased by providing the auxiliary ring 24, thereby uniforming the amount of generated magnetron plasma.

Figure 8:
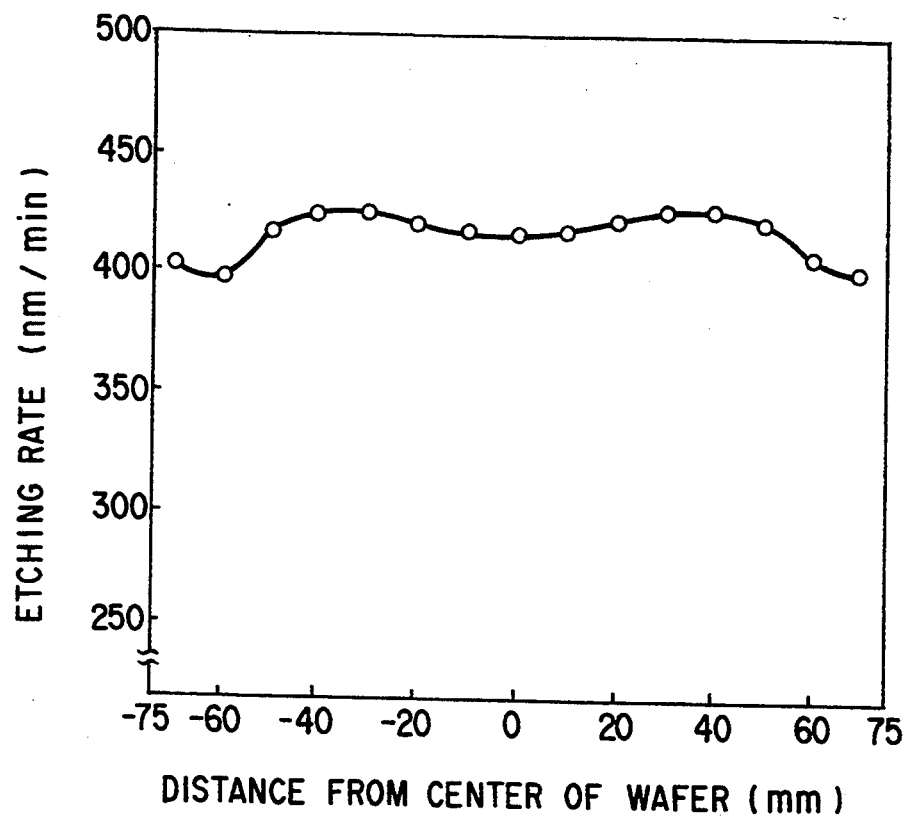
FIG. 8 is a graph showing a measurement result of a variation in wafer etching rate when the upper surface of an auxiliary ring is higher than the etching surface of the wafer by 3.5 mm in the magnetron plasma etching apparatus according to the second embodiment of the present invention.

FIGS. 6 to 8 are graphs each showing a measurement result of a variation in etching rate of the wafer 10 of this embodiment. Referring to FIGS. 6 to 8, the axis of abscissa represents a distance (unit: mm) from the center of the wafer 10, and the axis of ordinate represents an etching rate (unit: nm/min.). Measurements 10 were conducted in accordance with the measuring conditions shown in Table 1, as in the first embodiment described above. The gap (d in FIG. 2) between the outer circumference of the wafer 10 and the auxiliary ring 24 was set to 1.5 mm, in the same manner as in the first embodiment.

FIG. 6 shows a measurement result obtained when an auxiliary ring 24 is not provided. The measurement result shows that the average etching rate of the entire etching surface of the wafer 10 was 399.6 nm/min. and that the variation in etching rate was ±10.9% with reference to this average.

FIG. 7 shows a measurement result obtained when the upper surface of the auxiliary ring 24 is higher than the etching surface of the wafer 10 by 1.5 mm, i.e., when t=1.5 mm in FIG. 2. The average etching rate was 407.4 nm/min. and the variation in etching rate was ±9.4%. In this manner, when the auxiliary ring 24 higher than the etching surface of the wafer 10 by 1.5 mm was used, the etching rate was increased while remarkably decreasing the variation in etching rate.

FIG. 8 shows a measurement result obtained when the upper surface of the auxiliary ring 24 is higher than the etching surface of the wafer 10 by 3.5 mm, i.e., when t=3.5 mm in FIG. 2. The average etching rate was 412.6 nm/min. and the variation in etching rate was ±5.1%. In this manner, when the auxiliary ring 24 higher than the etching surface of the wafer 10 by 3.5 mm was used, the etching rate was increased while remarkably decreasing the variation in etching rate.

In this manner, even when the auxiliary ring 24 made of the insulating material is used, the etching rate at the peripheral portion of the wafer 10 can be increased in the same manner as in the first embodiment. An increase in etching rate at the peripheral portion of the wafer 10 can be controlled by the height of the auxiliary ring 24. Hence, the etching rate of the wafer 10 can be uniformed by appropriately selecting the height of the auxiliary ring 24, and especially by setting the height of the auxiliary ring 24 to 5 mm or less. Furthermore, in the second embodiment, the average etching rate can be increased as well.

Since the insulating material, e.g., SiO$_2$ does not contain carbon, an impurity is prevented from being generated during plasma processing. Further, if the circumference of the wafer 10 is surrounded by an insulating ring to form a circumferential wall, the generated plasma is confined in the circumferential wall to decrease leakage of the plasma from the upper surface of the wafer 10 to the outside. As a result, the wafer surface can be efficiently etched.

In the magnetron plasma etching apparatuses of the first and second embodiments, the inner surface 30a of the upper chamber element 30 is used as the cathode electrode, and the permanent magnet 38 is disposed outside the upper chamber element 30. However, a cathode electrode and a magnetic field generator can be disposed in the reaction chamber.

Figure 9:
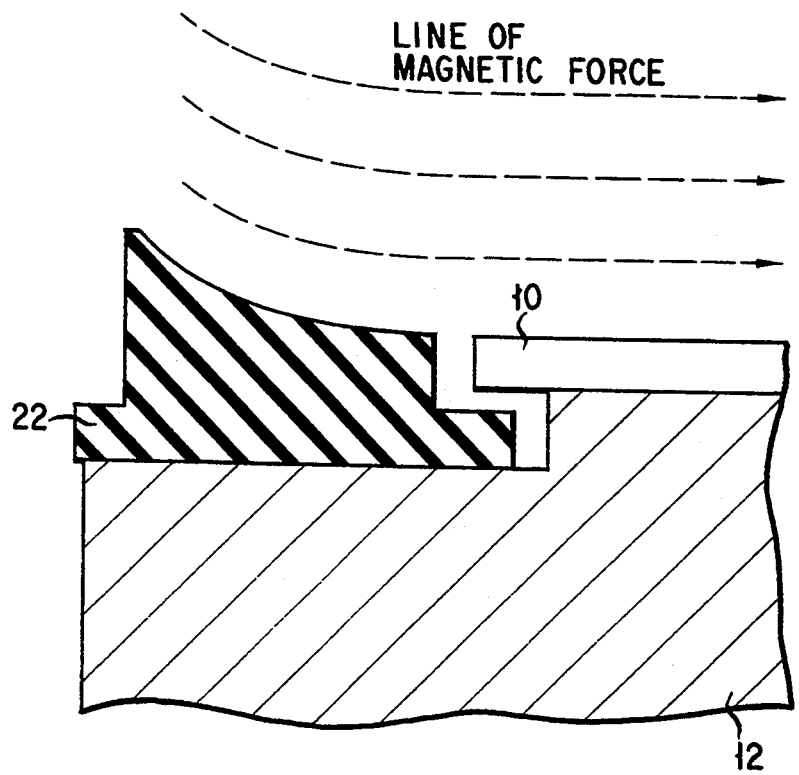
FIG. 9 is a schematic sectional view of another arrangement of an auxiliary ring according to the present invention.
Figure 10:
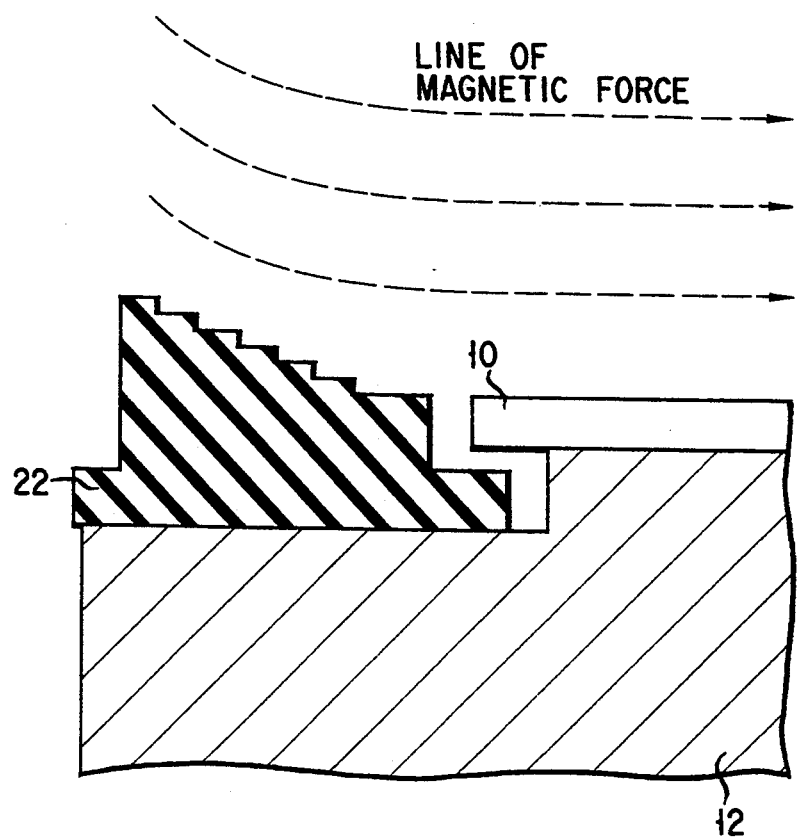
FIG. 10 is a schematic sectional view of still another arrangement of an auxiliary ring according to the present invention.

The upper surface of the auxiliary ring 24 is formed to be parallel with the inner surface 30a of the upper chamber element 30. However, it can be formed as a curved surface along the magnetic field (the line of magnetic force) generated by a permanent magnet 38, as shown in FIG. 9, or as a step-like surface along the magnetic field (the line of magnetic force), as shown in FIG. 10. When the auxiliary ring is formed to have a shape like this, the component of the electric field perpendicular to the magnetic field on the peripheral portion of the wafer can be strengthened. Then, the electronic cycloidal movement is activated at the peripheral portion of the wafer as well, thereby increasing the amount of generated plasma.

The ring may be separately formed as the cathode and auxiliary rings 22 and 24, as shown in FIGS. 1 and 2, or an integral ring may be used, as shown in FIGS. 9 and 10.

The present invention is not limited to a magnetron plasma etching apparatus but can similarly be applied to other magnetron plasma processing apparatuses, e.g., a plasma CVD apparatus.

Next, an explanation of the third embodiment of the present invention will be made with reference to FIGS. 11 to 19. Note that elements substantially the same with those of the previous embodiments will be denoted by the same reference numerals, respectively, so that relevant explanation thereof will be omitted.

As shown in FIG. 11, the lower chamber element 32 of an etching processing chamber 40 or the cylindrical main body having an opened upper surface is formed of aluminum, the surface of which has been alumite-processed. It is airtight-sealed by means of the upper chamber element or lid 30 which is disc shaped, for closing an opening 45, and an O-ring 44. The side wall of the main body of the chamber 40 is provided with two openings 45, opposing each other, for carrying in and out a semiconductor wafer 10. A carry-in load lock chamber 47a and a carry-out load lock chamber 47b are furnished outside of the etching-processing chamber 40 in such a way that the load lock chambers 47a and 47b are connected with the openings 45 via gate valves 46. Inside the load lock chambers 47a and 47b, there are carrier mechanisms 48 for carrying in and out the semiconductor wafer 10, respectively. Although FIG. 11 only shows a carrier mechanism 48 for use in carry-in, that for use in carry-out is provided in the same manner inside the carry-out load lock chamber 47b.

A lower electrode or susceptor 12 on which the semiconductor wafer 10 is mounted is connected to a high-frequency power supply 2 via a matching circuit 51. The ring-shaped member 22, placed on the susceptor 12, encircles the semiconductor wafer 10, while keeping a predetermined space between the ring-shaped member 22 and the periphery of the semiconductor wafer 10. Although in the preferred embodiment, the ring-shaped member 22 is formed of a silicon material, e.g., monocrystalline silicon, polycrystalline silicon and amorphous silicon, a front portion of the ring-shaped member 22 may not be necessarily formed of a silicon material. Merely an upper surface thereof may be formed of a silicon material.

A portion of the upper chamber element 30 of the etching-processing chamber 40, corresponding to the lower electrode 12, constitutes an upper electrode. Inside the upper electrode, a space 56 extending in a horizontal direction is formed. The space 56 communicates with an outlet of a gas supply pipe 4 extending outward out of the upper chamber element 30. In the space 56, two gas diffusion plates 57 are arranged in such a way that the plates 57, spaced away from each other vertically by a predetermined interval, extend in a horizontal direction and off-set a number of openings formed thereon. The inner surface of the upper chamber element 30 protrudes downward so that it is partially-spherical, with its lowest center point above the center of the wafer 10. Also, a number of vertical transparent holes 58 are provided so that the etching-processing chamber 30 communicates with the space 56. As a result, processing gas supplied to the space 56 via the gas supply pipe 4 is introduced into the etching processing chamber 30 via vertical transparent holes 58.

A permanent magnet 38 is disposed above the upper chamber element 30. When the permanent magnet 38 is rotated by a motor, a magnetic field similar to that shown in FIG. 1 is generated above the semiconductor wafer 10.

The function of etching a semiconductor wafer with the above-described structure of the etching apparatus will now be explained.

First, an exhaust pump 8 is actuated, thereby evacuating the etching-processing chamber 30 to a predetermined degree. The gate valve 49 of the carry-in load lock chamber 47a is made open and then the semiconductor wafer 10 is carried in the load lock chamber 47a by the carrier mechanism 48. After the gate valve 49 is closed, a predetermined vacuum degree in the load lock chamber 47a is set. The gate valve 46 is then opened, and the carrier mechanism causes the semiconductor wafer 10 to be mounted on the lower electrode 12. The semiconductor wafer 10 is kept on the lower electrode 12 by means of an electrostatic chuck (not shown), while a predetermined space is kept between the wafer 10 and the ring-shaped member 22.

Next, when the carrier mechanism 48 is made to get out of the etching-processing chamber 40 through the opening 45, the gate valve 46 is closed. A predetermined amount of etching gas is supplied from the gas supply pipe 4 to the processing chamber 44, a high-frequency current is supplied from the high-frequency power supply 2 to the lower electrode and the permanent magnet 38 is rotated, thereby converting the etching gas into plasma, so that the etching is carried out on the semiconductor wafer 10.

FIGS. 12 through 16 are graphs each showing a variation in etching rate of the $SiO_2$ film of the semiconductor wafer 10 in the case where the above-mentioned etching-processing is carried out, while changing the height of the ring-shaped member 22 under the condition similar to that shown in Table 1 except setting RF power to be 400 W.

Figure 17:
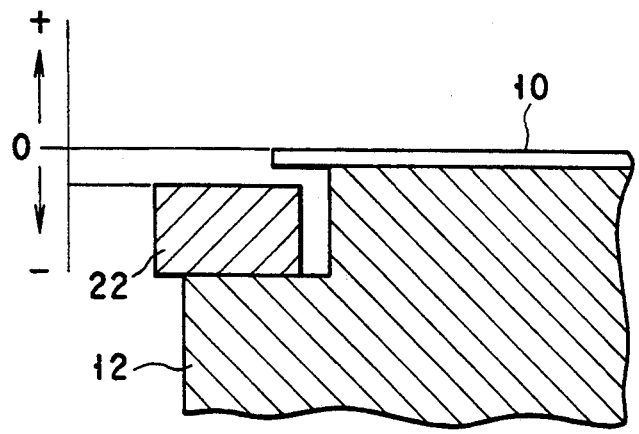
FIG. 17 is a view showing that the upper surface of a ring-shaped member is lower than the upper surface of a wafer.
Figure 18:
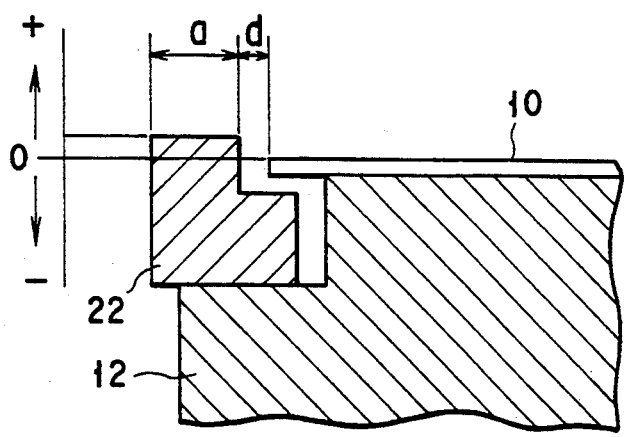
FIG. 18 is a view showing that the upper surface of a ring-shaped member is lower than the upper surface of a wafer.

In this case, as shown in FIGS. 17 and 18, a distance or width a between the outer and inner circumference surfaces of the ring-shaped member 22 is set to be 20 to 30 mm and a distance d between the outer circumference thereof and the circumference of the wafer 10 is set to be 1.5 mm. As to the way to express the height of the ring-shaped member 22, the height thereof is based on that of the upper surface of the semiconductor wafer 10; i.e., the ring-shaped member 22 higher than the upper surface of the wafer 10 is denoted by plus (+) and that lower than the upper surface thereof by minus (−). For instance, the height shown in FIG. 17 is −0.5 mm.

FIGS. 12, 13, 14, 15 and 16 show cases of −0.5 mm, +0.5 mm, +1.1 mm, +2.1 mm and +3.1 mm, respectively, where the ordinate represents an etching rate (unit: nm/min) and the abscissa represents a distance (unit: mm) from the center (0 mm) of the semiconductor wafer 10. The etching rate of the $SiO_2$ film of the semiconductor wafer 10 is measured with respect to two directions, perpendicular to each other, on the $SiO_2$ film (X and Y directions). Each of the Figures has two measurement results.

Figure 12:
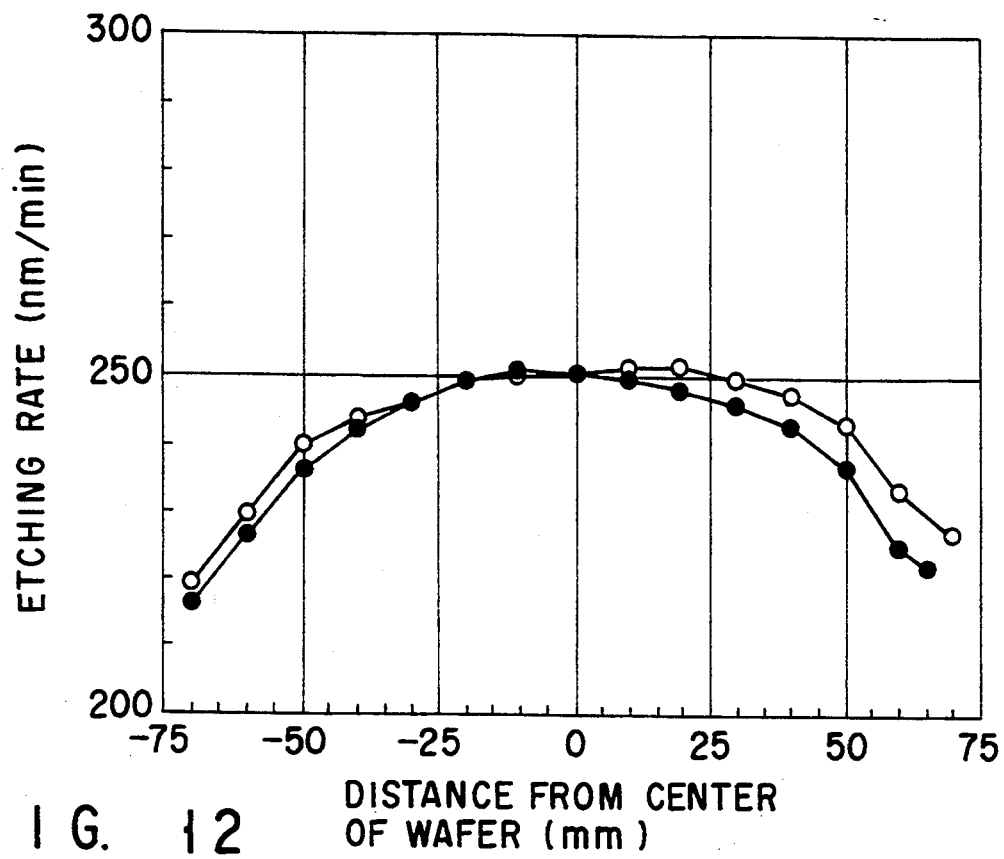
FIGS. 12 to 16 are graphs showing measurement results of variations in a wafer etching rate when the upper surface of a ring-shaped member is higher than the etching surface of the wafer by −0.5 mm, 0.5 mm, 1.1 mm, 2.1 mm and 3.1 mm, respectively.
Figure 13:
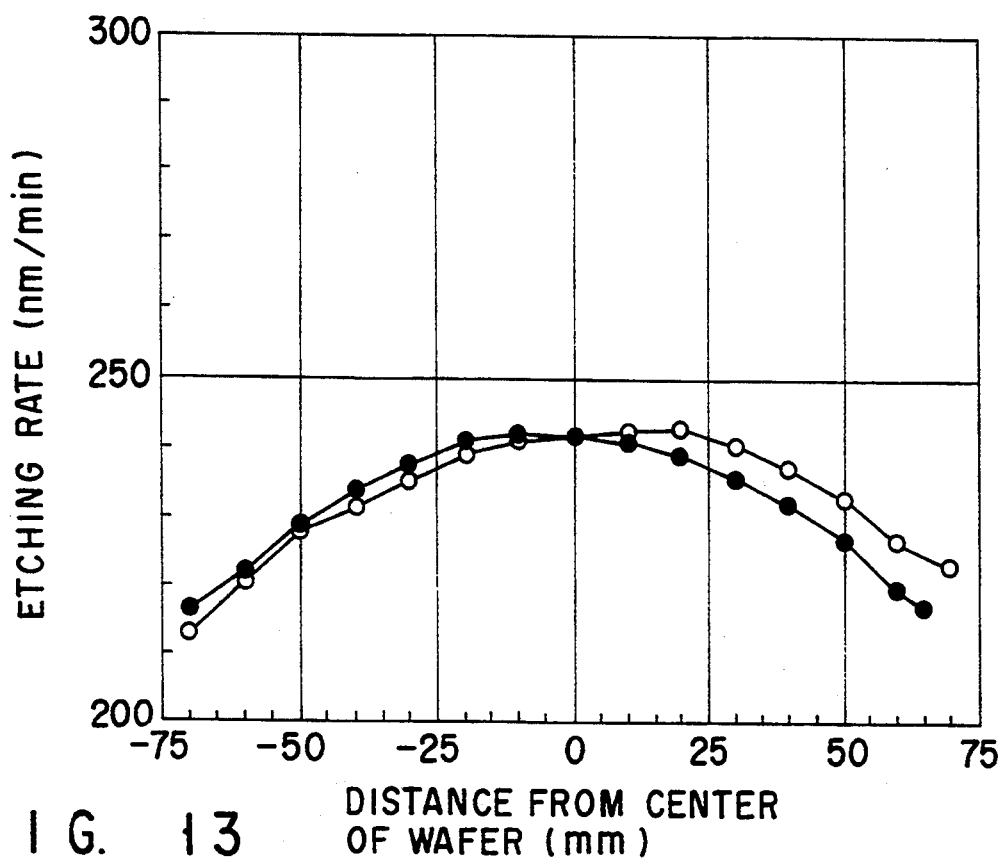
Figure 14:
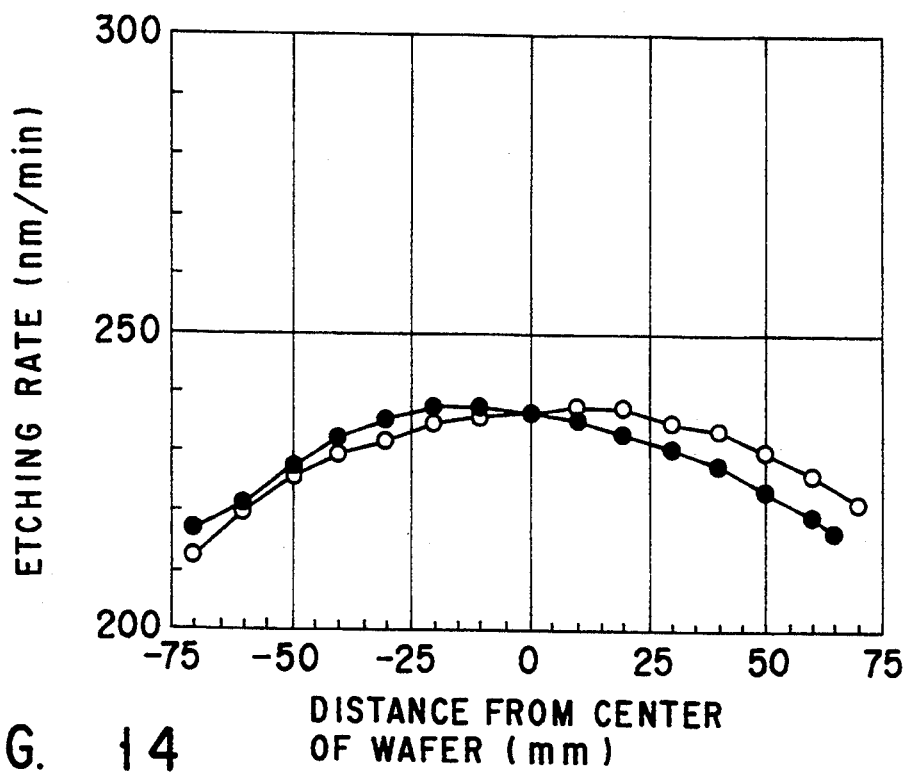

As is obvious from FIG. 12, in the case where the height of the upper surface of the ring-shaped member 22 is −0.5 mm, the etching rate of the $SiO_2$ film of the semiconductor wafer 10 obtained at the peripheral portion is lower than that obtained at the central portion. Also, FIGS. 13 and 14 show that in the case where the height of the upper surface of the ring-shaped member 22 is +0.5 mm and +1.1 mm, respectively, the etching rate obtained at the central portion becomes low gradually and the wafer, as a whole, becomes flat. On the other hand, as is apparent from FIGS. 15 and 16, when the height of the ring-shaped member 22 is +2.1 mm and +3.1 mm, respectively, the etching rate obtained at the peripheral portion of the $SiO_2$ film is higher than that obtained at the central portion thereof, so that the wafer 10 becomes uneven. Further, FIG. 19 is a graph showing the uniformity of measurement results shown in FIGS. 12 to 16, where the ordinate represents a uniformity (unit: %) and the abscissa represents a height of the ring-shaped member 22 (unit: mm).

As is apparent from FIG. 19, in the case of etching the $SiO_2$ film, the setting of the height of the upper surface of the ring-shaped member 22 to fall within the range of −0.5 mm to +2.5 mm allows carrying out the uniform etching in such a way that the uniformity is not more than around 7%. By comparison, in the case where an $SiO_2$ film is etching-processed without a ring-shaped member 22, the uniformity is around 10%.

Figure 15:
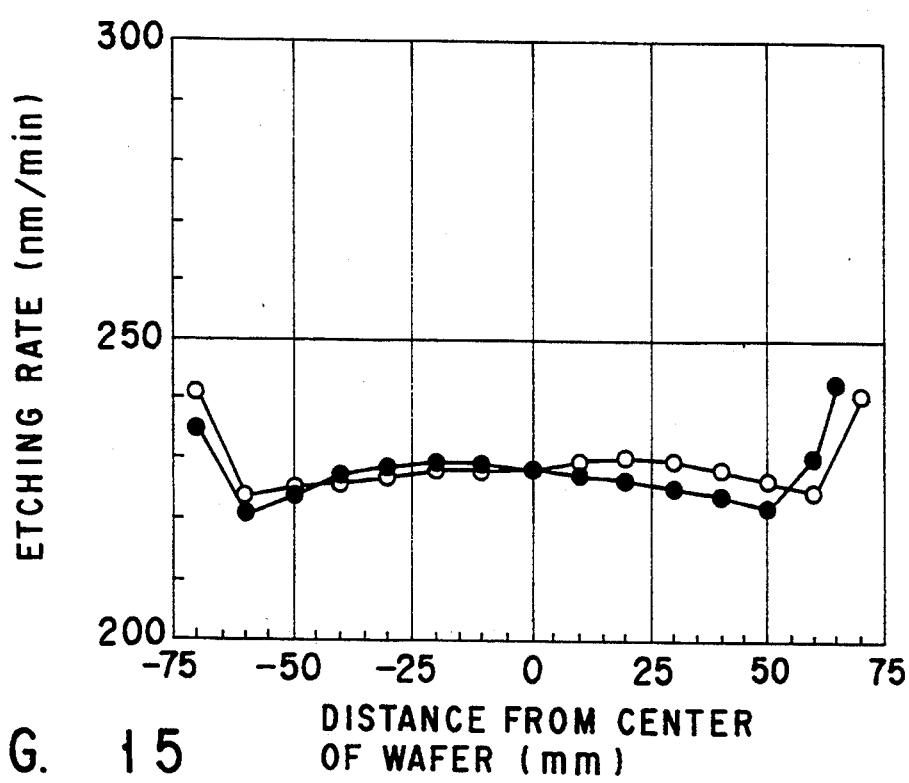
Figure 16:
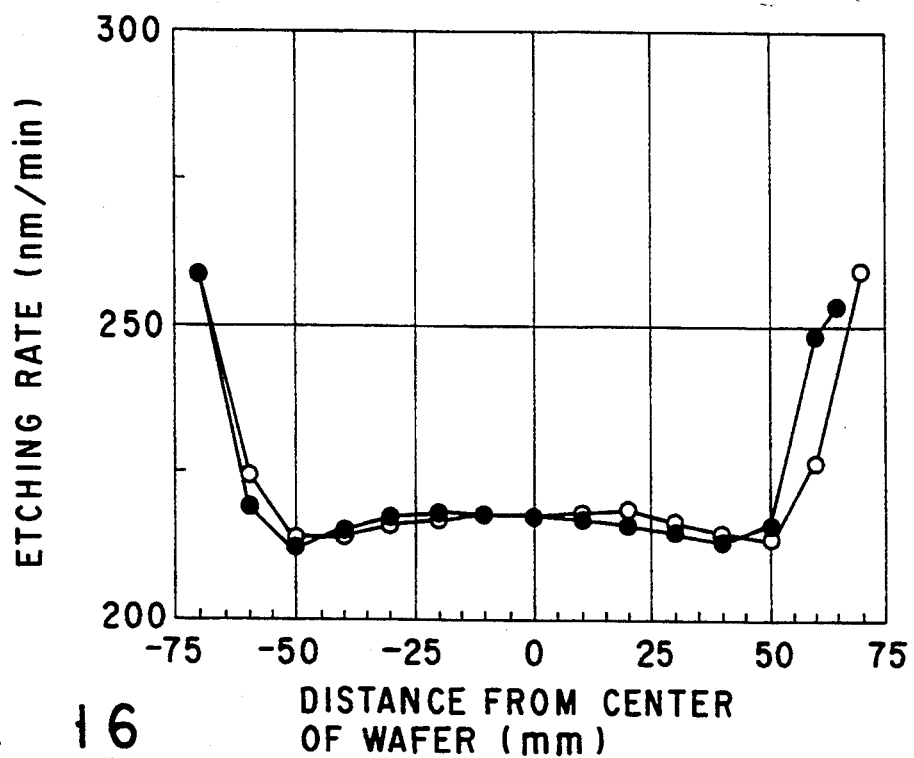

The configuration of curves showing the etching rate distribution is varied from FIG. 14 (convex) to FIG. 15 (concave). It follows that the setting of the height of the upper surface of the ring-shaped member 22 to come within the range of +1.1 mm to +2.1 mm, e.g. 1.5 mm, enables etching-processing in a way which is more uniform. Note, the uniformity here is around 5%.

The optimal height of the ring-shaped member 22 depends on the etching-processing method to be chosen. For instance, in the case of etching-processing polysilicon, utilizing $Cl_2$ as etching gas, the optimal height is around −0.5 mm.

According to the third embodiment, the apparatus can improve the surface uniformity in the etching-processing and concurrently can prevent impurities from mixing into and thus polluting the semiconductor wafer 10 even if etching is carried out on the upper surface of the ring-shaped member 22, which is formed of silicon.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetron plasma processing apparatus comprising:
    a reaction chamber for housing an object to be processed;
    first and second electrodes which are provided in the reaction chamber, the first electrode for placing the object to be processed thereon and the second electrode opposing said first electrode through the object to be processed on the first electrode;
    means for applying a voltage between the first and second electrodes to generate an electric field between the first and second electrodes;
    a permanent magnet rotatably provided outside the reaction chamber having opposing ends of different polarities to generate a magnetic field between the first and second electrodes, a component of the magnetic field above a central portion of the object to be processed being stronger than a component of the magnetic field above a peripheral portion of the object to be processed;
    means for rotating the permanent magnet;
    means for supplying a reaction gas into the reaction chamber to generate a magnetron plasma by functions of the electric field and the magnetic field; and
    plasma increasing means, provided to surround the peripheral portion of the object to be processed, for strengthening a component of the electric field perpendicular to the magnetic field and increasing an amount of plasma generated at the peripheral portion of the object to be processed.

2. The apparatus according to claim 1, wherein said plasma increasing means includes a ring disposed on said first electrode to surround the peripheral portion of the object to be processed.

3. The apparatus according to claim 2, wherein said ring has a thickness with which a distance between an upper surface thereof and said second electrode is shorter than a distance between an upper surface of the object to be processed placed on said first electrode and said second electrode.

4. The apparatus according to claim 3, wherein said ring is made of a conductive material.

5. The apparatus according to claim 4, wherein said ring projects from the upper surface of the object to be processed by less than 3.5 mm.

6. The apparatus according to claim 4, wherein said ring is made of SiC.

7. The apparatus according to claim 4, wherein said ring projects from the upper surface of the object to be processed by almost 1.5 mm.

8. The apparatus according to claim 4, wherein said ring is made of SiC or amorphous carbon.

9. The apparatus according to claim 3, wherein said ring is made of an insulating member.

10. The apparatus according to claim 9, wherein said ring projects from the upper surface of the object to be processed by not more than 5 mm.

11. The apparatus according to claim 9, wherein said ring is made of $SiO_2$.

12. The apparatus according to claim 2, wherein said ring has a ring-shaped member at least an upper surface of which is formed of a silicon material.

13. The apparatus according to claim 12, wherein said silicon material is made of at least one of monocrystalline silicon, polycrystalline silicon and amorphous silicon.

14. The apparatus according to claim 13, wherein said ring has the upper surface which is higher than an upper surface of the object to be processed.

15. The apparatus according to claim 14, wherein said ring has the upper surface which is higher than the upper surface of the object to be processed by 0.5 mm to 2.5 mm.

16. The apparatus according to claim 13, wherein said ring has the upper surface which is lower than the upper surface of the object to be processed.

17. The apparatus according to claim 16, wherein said ring has the upper surface which is lower than the upper surface of the object to be processed by 0.5 mm.

* * * * *

UNITED STATES PATENT AND TRADEMARK OFFICE
CERTIFICATE OF CORRECTION

PATENT NO. : 5,411,624
DATED : May 2, 1995
INVENTOR(S) : Yoshihisa HIRANO, et al.

It is certified that error appears in the above-indentified patent and that said Letters Patent is hereby corrected as shown below:

On the title page, Item [75], the second inventor's name should read:

--Yoshifumi Tahara--

Signed and Sealed this

Twenty-seventh Day of June, 1995

Attest:

BRUCE LEHMAN

Attesting Officer     Commissioner of Patents and Trademarks